United States Patent
Lee et al.

(10) Patent No.: US 10,964,612 B2
(45) Date of Patent: Mar. 30, 2021

(54) DISPLAY DEVICE

(71) Applicant: LG Display Co., Ltd., Seoul (KR)

(72) Inventors: Soobin Lee, Seoul (KR); SungHyun Jang, Paju-si (KR); Minji Han, Iksan-si (KR); Junho Yeo, Paju-si (KR); JeeHwan Oh, Goyang-si (KR); Seokhwan Choi, Gwangju (KR); YeongHo Yun, Gumi-si (KR); Youngkwun Kim, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 116 days.

(21) Appl. No.: 16/517,292

(22) Filed: Jul. 19, 2019

(65) Prior Publication Data

US 2020/0203236 A1    Jun. 25, 2020

(30) Foreign Application Priority Data

Dec. 20, 2018    (KR) ........................ 10-2018-0166589

(51) Int. Cl.
    *H01L 21/66*      (2006.01)
    *G01R 31/28*      (2006.01)
    *H01L 27/32*      (2006.01)

(52) U.S. Cl.
    CPC .......... *H01L 22/34* (2013.01); *G01R 31/2884* (2013.01); *H01L 27/3276* (2013.01)

(58) Field of Classification Search
CPC ..... H01L 22/34; H01L 27/32; H01L 27/3225; H01L 27/3237; H01L 27/3241; H01L 27/3244; H01L 27/3276; G01R 31/2884; G09G 2300/0426; G09G 3/006; G01N 27/041; G01N 27/20
See application file for complete search history.

(56) References Cited

U.S. PATENT DOCUMENTS

2018/0158894 A1    6/2018    Park et al.
2018/0175131 A1*    6/2018    Lee ..................... H01L 27/3276

FOREIGN PATENT DOCUMENTS

KR      10-2018-0065061 A      6/2018

\* cited by examiner

*Primary Examiner* — Thanhha S Pham
(74) *Attorney, Agent, or Firm* — Fenwick & West LLP

(57) ABSTRACT

A display device includes a display panel having a display area and a non-display area, crack lines disposed in the non-display area; and a first crack pad and a second crack pad connected to both ends of the crack lines. The crack lines comprise a plurality of crack line units connected to each other. Each of the plurality of crack line units comprises a plurality of sub-crack lines connected in parallel. In this manner, the efficiency of inspecting for cracks can be improved.

20 Claims, 7 Drawing Sheets

DISPLAY DEVICE

CROSS-REFERENCE TO RELATED APPLICATIONS

This application claims the priority of Republic of Korea Patent Application No. 10-2018-0166589 filed on Dec. 20, 2018, in the Korean Intellectual Property Office, the disclosure of which is incorporated herein by reference in its entirety.

BACKGROUND

Technical Field

The present disclosure relates to a display device, and more particularly to a display device capable of detecting a crack in a display panel.

Description of the Related Art

As the era of information technology has truly begun, the field of display device that represents information contained in electrical signals in the form of visual images has been rapidly grown up. In accordance with this, research is ongoing into various flat display devices which are thinner, lighter and consume less power. Examples of flat panel display devices include a liquid crystal display (LCD) device, a plasma display panel (PDP) device, a field emission display (FED) device, an electro-wetting display (EWD) device, and an organic light emitting display (OLED) device, etc.

In order to reduce the rejection rates in fabricating flat panel display devices, a process of inspecting for cracks in the display panel is required as a kind of inspections of the flat panel display devices before they are released.

Previously, the process of inspecting for cracks includes a process of determining whether there is a crack from crack detection lines disposed at the outer edge of the display panel, and a process of locating the position of a crack by an inspector.

That is to say, the existing process of inspecting for cracks requires additional inspection personnel and inspection time, which makes the process less efficient.

SUMMARY

The inventors of the present disclosure have recognized the problem of causing inefficiency in the process because the existing process of inspecting for cracks requires the additional inspection personnel and inspection time.

Specifically, previously, in order to inspect for cracks of the display panel, a crack detection line for inspecting for a crack is disposed on the outer edge of the display panel, and it is determined if there is a crack based on whether the crack detection line is open.

However, in the existing process of inspecting for cracks, it is possible to detect whether there is a crack in the display panel but it is not possible to locate the position of the crack in the display panel. Accordingly, in order to locate the position of the crack accurately, an inspection personnel has to observe the entire area of the display panel with a microscope.

In view of the above, the inventors of the present disclosure have devised a display device capable of determining the number and position of cracks by simply measuring the resistance of crack inspection lines.

An object of the present disclosure is to provide a display device capable of detecting the number of position of cracks.

In addition, another object of the present disclosure is to provide a display device that includes crack detection lines and reduces the size of the bezel.

Objects of the present disclosure are not limited to the above-mentioned objects, and other objects, which are not mentioned above, can be clearly understood by those skilled in the art from the following descriptions.

According to an aspect of the present disclosure, there is provided a display device including a display panel having a display area and a non-display area, crack lines disposed in the non-display area, and a first crack pad and a second crack pad connected to both ends of the crack lines. The crack lines comprise a plurality of crack line units connected in series and each having different resistances. Each of the plurality of crack line units comprises a plurality of sub-crack lines connected in parallel. In this manner, the efficiency of inspecting for cracks can be improved.

According to another aspect of the present disclosure, there is provided a display device including a substrate on which a plurality of pixels are defined; crack lines surrounding the pixels, and a crack detecting unit configured to measure a resistance of the crack lines, wherein the resistance of the crack lines varies depending on a position and number of cracks. In this manner, it is possible to determine a position where cracks have occurred and the number of cracks during the process of inspecting for cracks.

Other detailed matters of the exemplary embodiments are included in the detailed description and the drawings.

According to an exemplary embodiment of the present disclosure, it is possible to determine the position and number of cracks based on the resistances of crack lines, and thus no additional inspection personnel or inspection time is required, thereby improving the process yield of the display devices.

In addition, according to an exemplary embodiment of the present disclosure, by disposing sub-crack lines on different layers, it is possible to reduce the size of the bezel where the crack lines are disposed.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE PREFERRED EMBODIMENT

Figure 1:
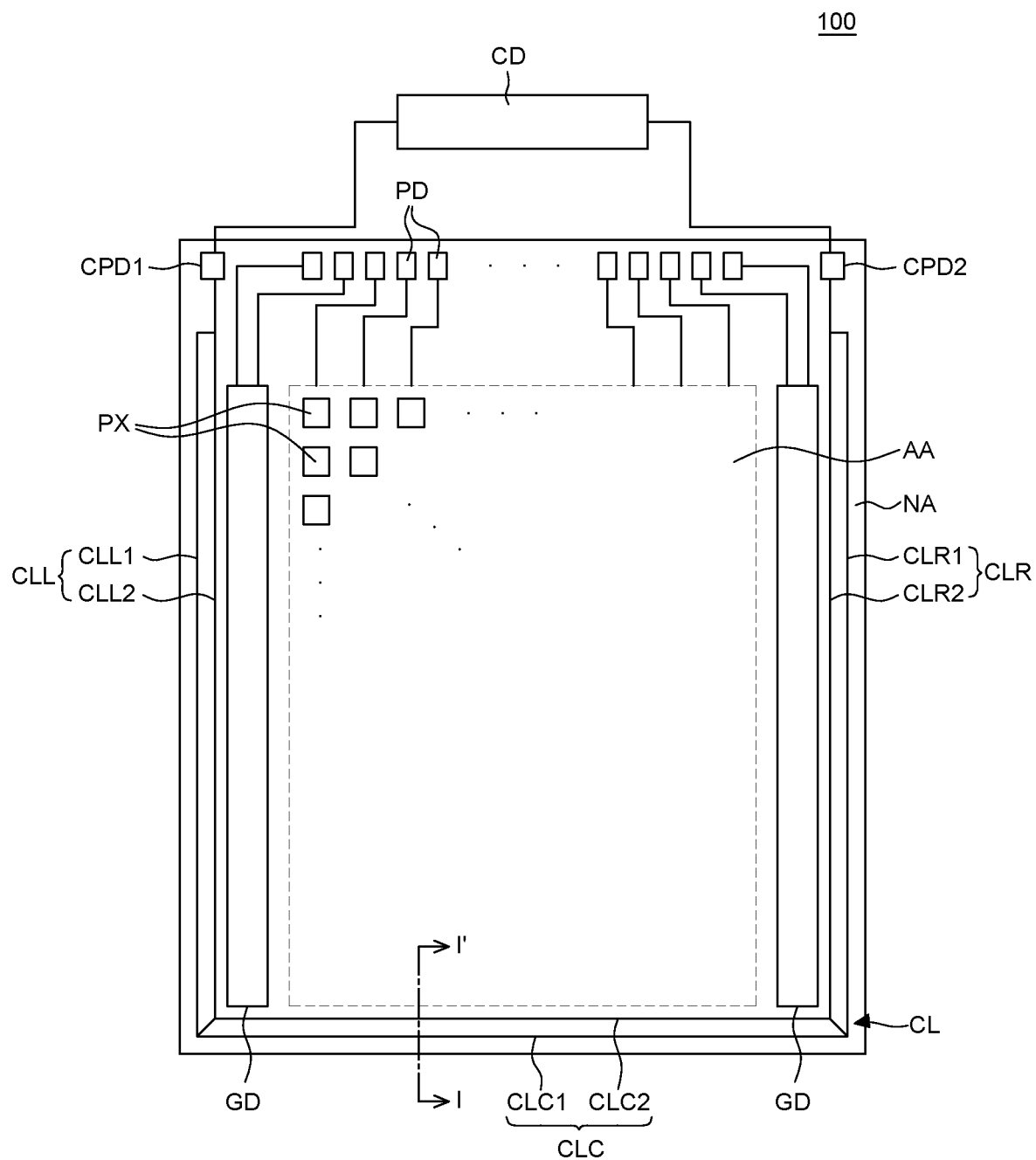
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated technically in various ways, and the embodiments can be carried out independently of or in association with each other.

Hereinafter, a display device according to exemplary embodiments of the present disclosure will be described in detail with reference to accompanying drawings.

Figure 2:
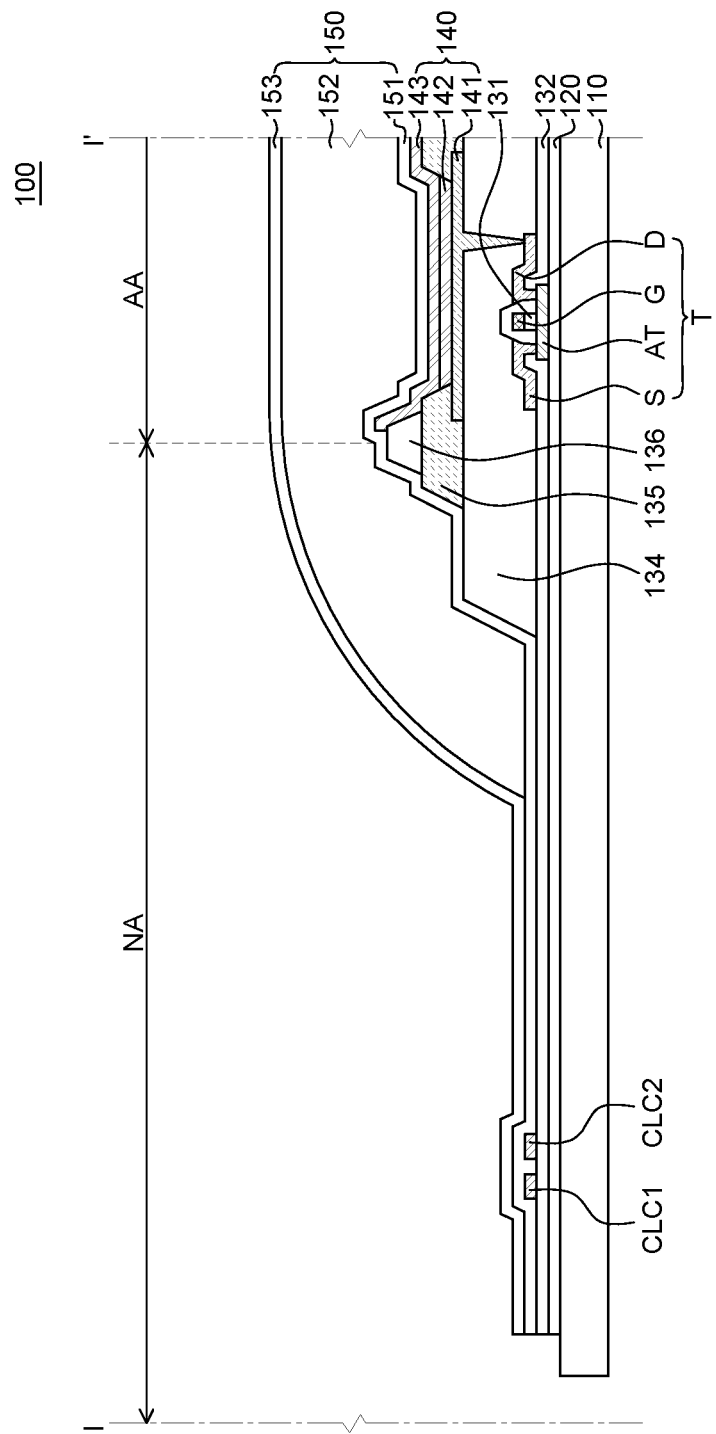
FIG. 2 is a cross-sectional view taken along line I-I' of FIG. 1 according to an exemplary embodiment of the present disclosure.

FIG. 1 is a schematic plan view of a display device according to an exemplary embodiment of the present disclosure. FIG. 2 is a cross-sectional view taken along line I-I' of FIG. 1 according to an exemplary embodiment of the present disclosure.

Referring to FIG. 1, a display panel of a display device 100 according to an exemplary embodiment of the present disclosure includes a display area AA including a plurality of pixels PX to display an image, and a non-display area NA.

Each of the plurality of pixels PX disposed in the display area AA may include an organic light-emitting element 140 and a thin-film film transistor T. The thin-film transistors T of the pixels PX are sequentially driven by gate drivers GD, such that the organic light-emitting element 140 emits light to display an image.

In the non-display area NA, the gate drivers GD for sequentially driving the plurality of pixels PX, a plurality of pads PD to which a driving voltage and a data signal are applied from an external system, and signal lines for transferring the driving voltage or data signal applied to the pads PD to the plurality of pixels PX or the gate drivers GD are disposed.

Although the gate drivers GD disposed in the non-display area NA are shown as gate-in-panels (GIPS) disposed adjacent to both sides of the display area AA, respectively, this is merely illustrative. The positions of the gate drivers may be altered as desired.

In addition, crack lines CL for detecting a crack of the display panel is disposed at the outermost portion of the non-display area NA. Crack pads CPD1 and CPD2 are disposed at both ends of the crack lines CL so as to be connected to a crack detecting unit CD.

Specifically, the crack lines CL are disposed such that they surround the pixels PX arranged in the display area AA and the gate drivers GD disposed in the non-display area NA. The resistances thereof vary depending on the number and the position of cracks.

Specifically, the crack lines CL include a plurality of crack line units CLL, CLC and CLR that are connected to one another in series and have different resistances. In the example shown in FIG. 1, the crack lines CL include a left crack line unit CLL disposed on the left portion of the non-display area NA, a central crack line unit CLC disposed on the central lower portion of the non-display area NA, and a right crack line unit CLR disposed on the right portion of the non-display area NA.

Specifically, the left crack line unit CLL and the central crack line unit CLC are connected in series, and the central crack line unit CLC and the right crack line unit CLR are connected in series, to constitute the crack lines CL.

The left crack line unit CLL includes a first left sub-crack line CLL1 and a second left sub-crack line CLL2 connected in parallel. The first left sub-crack line CLL1 may be disposed more adjacent to the outer side, i.e., the left side than the second left sub-crack line CLL2. The right crack line unit CLR includes a first right sub-crack line CLR1 and a second right sub-crack line CLR2 connected in parallel. The first right sub-crack line CLR1 may be disposed more adjacent to the outer side, i.e., the right side than the second right sub-crack line CLR2. The central crack line unit CLC includes a first central sub-crack line CLC1 and a second central sub-crack line CLC2 connected in parallel. The first central sub-crack line CLC1 may be disposed more adjacent to the outer side, i.e., the lower side than the second central sub-crack line CLC2. However, it is to be noted that although the number of sub-crack lines included in each of the crack line units CLL, CLC and CLR is shown as 2 in the figures of the present disclosure, but the present disclosure is not limited thereto. For example, each of the crack line units CLL, CLC and CLR may have one, or three or more sub-crack lines.

The crack pads CPD1 and CPD2 include a first crack pad CPD1 connected to the left crack line unit CLL, and a second crack pad CPD2 connected to the right crack line unit CLR. Both the first crack pad CPD1 and the second crack pad CPD2 may be integrally formed in the same layer as the crack lines CL. It is, however, to be understood that the present disclosure is not limited thereto. The first crack pad CPD1 and the second crack pad CPD2 may be altered in a variety of ways depending on the wiring design.

The crack detecting unit CD may measure the resistance of the crack lines CL to detect the position and the number of cracks.

That is to say, the crack detecting unit CD may be connected to the left crack line unit CLL via the first crack pad CPD1 and may be connected to the right crack line unit CLR via the second crack pad CPD2, thereby measuring the total resistance of the crack lines CL.

As will be described later with reference to FIG. 3, the position and the number of cracks can be determined based on the total resistance of the crack lines CL. A detailed description thereon will be given later.

As described above, each of the plurality of crack line units CLL, CLC and CLR includes a plurality of sub-crack lines CLL1, CLL2, CLC1, CLC2, CLR1, and CLR2 connected in parallel, even if some of the sub-crack lines CLL1, CLL2, CLC1, CLC2, CLR1 and CLR2 connected in parallel are broken by an external force, the crack lines CL are not open but can be closed so as to constantly have a resistance.

For example, even if the first left sub-crack line CLL1 of the left crack line unit CLL is broken, the second left sub-crack line CLL2 disposed on the inner side is still connected, and accordingly the crack lines CL are not open but can be closed so as to constantly have a resistance.

As such, even if a crack occurs in the display panel by an external force, the crack lines CL are not open but can be closed so as to constantly have a resistance, and thus the crack detecting unit CD can measure the resistance of the crack lines CL to thereby determine the position and number of cracks on the crack lines CL.

Referring to FIG. 2, a buffer layer 120 is formed on a substrate 110 in the display area AA, and a thin-film transistor T and an organic light-emitting element 140 are disposed on the buffer layer 120.

Although an organic light-emitting display device (OLED) is described as an example of the display device according to the exemplary embodiment of the present disclosure, this is merely illustrative. It is to be understood that a liquid-crystal display (LCD) device, a field emission display (FED) device, Quantum-dot light-emitting display device (QLED), or an electro-wetting display (EWD) device may be employed as the display device according to the exemplary embodiment of the present disclosure.

The substrate 110 may be either rigid or flexible. As used herein, the term "flexible" may encompass bendable, unbreakable, rollable, foldable, etc.

For example, the substrate 110 may be made of glass or plastic, in which case the substrate 110 may be referred to as a plastic film or a plastic substrate. For example, the substrate 110 may be made of a material selected from the group consisting of: a polyester-based polymer, a silicon-based polymer, an acrylic-based polymer, a polyolefin-based polymer and a copolymer thereof. For example, the substrate 110 may be made of polyimide (PI). Polyimide (PI) is widely used as a plastic substrate because it can withstand a high-temperature process and can be coated.

When the substrate 110 is made of polyimide (PI), the display device may be fabricated with a glass support substrate under the substrate 110, and the support substrate may be released after the display device has been produced. After the support substrate is released, a back plate may be disposed under the substrate 110 to support it.

The buffer layer 120 is disposed on the substrate 110 to protect the thin-film transistor T from impurities such as alkali ions that leak out of the substrate 110. For example, the buffer layer 120 may be made up of a single layer of silicon nitride (SiNx) or silicon oxide (SiOx), or multiple layers of silicon nitride (SiNx) and silicon oxide (SiOx). In addition, the buffer layer 120 can enhance the adhesion between the layers formed thereon and the substrate 110 and may block moisture or oxygen permeating through the substrate 110.

The thin-film transistor T is formed on the buffer layer 120 and includes a gate electrode G, an active layer AT, a source electrode S and a drain electrode D to switch the organic light-emitting element.

Specifically, the active layer AT is formed on the buffer layer 120, and a gate insulating layer 131 is formed on the active layer AT for insulating the active layer AT from the gate electrode G. The gate electrode G is formed on the gate insulating layer 131 such that it overlaps with the active layer AT. An interlayer dielectric layer 132 is formed on the gate electrode G and the gate insulating layer 131. The source electrode S and the drain electrode D are formed on the interlayer dielectric layer 132. The source electrode S and the drain electrode D are electrically connected to the active layer AT through contact holes formed in the interlayer dielectric layer 132, respectively. The interlayer dielectric layer 132 serves to insulate the gate electrode G from the source electrode S and the drain electrode D of the thin-film transistor T.

The active layer AT may be made of polycrystalline silicon, a predetermined region of which may be doped with impurities. In addition, the active layer AT may be made of amorphous silicon, an organic semiconductor material, or an oxide.

Each of the gate insulating layer 131 and interlayer dielectric layer 132 may be made of an insulative inorganic material such as silicon oxide (SiOx) and silicon nitride (SiNx) or may be made of an insulative organic material.

Each of the gate electrode G, the source electrode S and the drain electrode D may be made of a metal material. For example, it may be made of, but is not limited to, one of molybdenum (Mo), aluminum (Al), chrome (Cr), gold (Au), titanium (Ti), nickel (Ni), neodymium (Nd), copper (Cu), and a triple layer of titanium-aluminum-titanium (Ti—Al—Ti), or an alloy thereof. The source electrode S and the drain electrode D may include a material that can be etched by an etchant used when the anode 141 of the organic light-emitting element 140 is etched. Each of the gate electrode G, the source electrode S and the drain electrode D may be a single layer or a multilayer formed of the above-described materials. Although the thin-film transistor T has a coplanar structure in this exemplary embodiment, this is merely illustrative. Any of a variety of thin-film transistors having various structures may be employed by the display device 100.

A planarization layer 134 is disposed over the thin-film transistor T and serves to provide a flat surface over the thin film transistor T. The planarization layer 134 includes a contact hole for electrically connecting the thin-film transistor T to the anode 141 of the organic light-emitting element 140. Specifically, the planarization layer 134 includes a contact hole for exposing either the source electrode S or the drain electrode D of the thin-film transistor T. The planarization layer 134 may be made of an organic insulating material. Although the planarization layer 134 is shown as a single layer in FIG. 2, the planarization layer 134 may be made up of double layers, triple layers, or multiple layers.

The planarization layer 134 may be in direct contact with the source electrode S and the drain electrode D of the thin-film transistor T. A separate passivation layer may not be disposed on the source electrode S and the drain electrode D of the thin-film transistor T, and the planarization layer 134 may be disposed directly on the source electrode S and the drain electrode D of the thin-film transistor T. But, the present disclosure is not limited thereto. For example, a passivation layer may be interposed between the planarization layer 134 and the thin-film transistor T.

The organic light-emitting element 140 is disposed on the planarization layer 134. The organic light-emitting element 140 includes the anode 141 on the planarization layer 134, an organic emitting layer 142 on the anode 141, and a cathode 143 on the organic emitting layer 142.

The anode 141 is disposed in the contact hole and on a part of the planarization layer 134 in each of the pixels PX, and is separated from another anode. The anode 141 may supply holes to the organic emitting layer 142 and may be made of a conductive material having a high work function. For example, the anode 141 may be made of a transparent conductive oxide (TCO) such as indium tin oxide (ITO).

When the display device 100 is a top-emission display device, the anode 141 may be formed as a transparent conductive layer including a reflective layer having high reflectance at the bottom, for example. In other words, when the display device 100 is a top-emission display device, the anode 141 may further include a reflective layer that reflects light toward the top. Although the reflective layer is described to be included in the anode 141 in this exemplary embodiment, the reflective layer may be defined as a separate element from the anode 141.

The organic emitting layer 142 is made of an organic material for emitting light of a particular color and may be one of a red organic emitting layer, a green organic emitting layer, a blue organic emitting layer and a white organic emitting layer. When the organic emitting layer 142 is implemented as the white organic emitting layer, a color filter may be formed above the organic light-emitting element 140.

The cathode 143 may supply electrons to the organic emitting layer 142 and may be made of a conductive material having a low work function. When the display device 100 is a top-emission display device, the cathode 143 may be implemented as a transparent conductive layer and may be formed of a very thin metal material, for example.

The bank layer 135 is disposed on the planarization layer 134 to cover a part of the anode 141 and isolates the pixel regions from one another in the display area AA. In addition, the bank layer 135 may be made of an organic insulating material such as BCB, acrylic resin and imide resin.

A spacer 136 is disposed on the bank 135. During the process of forming the organic emitting layer 142 on the substrate 110 using a fine metal mask (FMM) as a deposition mask, the spacer 136 serves to prevent damages that may occur when the bank layer 135 comes in contact with the deposition mask and to maintain the gap between the bank layer 135 and the deposition mask. The spacer 136 may also be made of an organic insulating material or an inorganic insulating material.

An encapsulation layer 150 is disposed on the whole surface of the display area AA. The encapsulation layer 150 can protect the organic light-emitting element 140 from external moisture and the like. The encapsulation layer 150 may be made of a transparent material so that light emitted from the organic light-emitting elements 140 can pass through it. The encapsulation layer 150 includes a first encapsulation layer 151, a particle cover layer 152, and a second encapsulation layer 153.

The first encapsulation layer 151 and the second encapsulation layer 153 may be made of an inorganic material having transparency. For example, the inorganic material may include silicon nitride (SiNx), silicon oxide (SiOx), aluminum oxide (AlxOy), etc.

The particle cover layer 152 is disposed between the first encapsulation layer 151 and the second encapsulation layer 153. The particle cover layer 152 may cover particles caused by cracks that may occur during the process of forming the first encapsulation layer 151 or the second encapsulation layer 153. The particle cover layer 152 may be made of an organic material that can flow and is transparent. For example, the organic material may include an epoxy resin, an acryl resin, silicon oxygen carbon (SiOC), etc.

Referring to FIG. 2, the buffer layer 120, on the substrate 110, the interlayer dielectric layer 132 and the encapsulation layer 150 may be extended from the display area AA to the non-display area NA.

Referring to FIG. 2, a first central sub-crack line CLC1 and a second central sub-crack line CLC2 may be made of the same material as the source electrode S and the drain electrode D on the interlayer dielectric layer 132 and may be formed together with the source electrode S and the drain electrode D. Similarly, the first left sub-crack line CLL1, the second left sub-crack line CLL2, the first right sub-crack line CLR1 and the second right sub-crack line CLR2 may be made of the same material as the source electrode S and the drain electrode D on the interlayer dielectric layer 132 and may be formed together with the source electrode S and the drain electrode D.

However, the present invention is not limited thereto. The plurality of sub-crack lines CLL1, CLL2, CLC1, CLC2, CLR1 and CLR2 may be made of the same material as the gate electrode G on the gate insulating layer 131 and may be formed together with the gate electrode G.

Figure 3A:
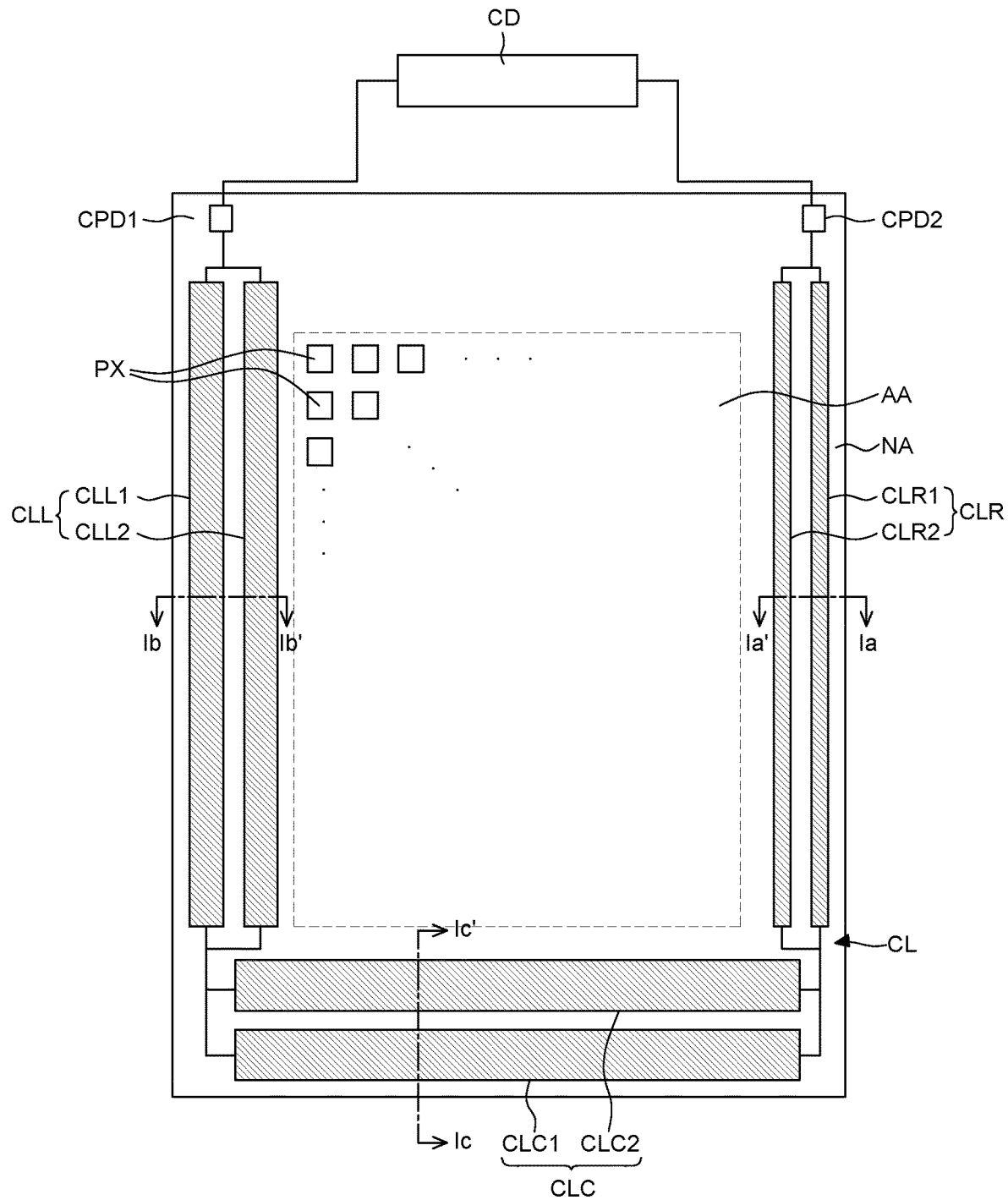
FIG. 3A is a view for illustrating the widths of the crack lines of a display device according to an exemplary embodiment of the present disclosure.
Figure 3B:
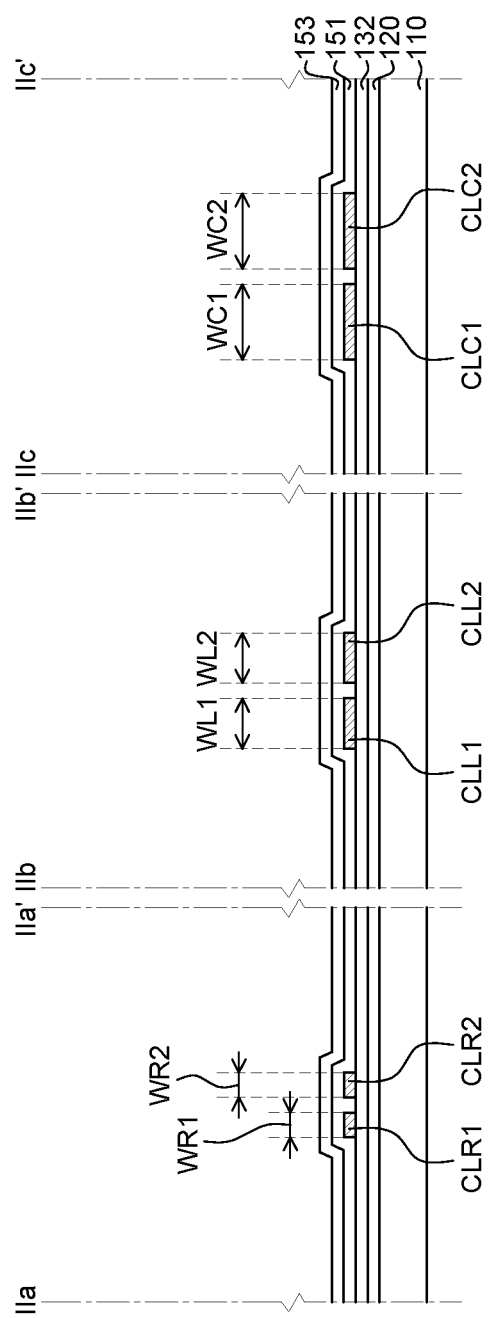
FIG. 3B is a cross-sectional view taken along lines IIa-IIa', IIb-IIb' and IIc-IIc' shown in FIG. 3A according to an exemplary embodiment of the present disclosure.

FIG. 3A is a view for illustrating the widths of the crack lines of a display device according to an exemplary embodiment of the present disclosure. FIG. 3B is a cross-sectional view taken along lines IIa-IIa', IIb-IIb' and IIc-IIc' shown in FIG. 3A.

As described above, the resistances of the left crack line unit CLL, the right crack line unit CLR and the central crack line unit CLC must be set differently from one another.

To this end, as shown in FIG. 3A, the width of each of the first central sub-crack line CLC1 and the second central sub-crack line CLC2, the width of each of the first left sub-crack line CLL1 and the second left sub-crack line CLL2, and the width of each of the first right sub-crack line CLR1 and the second right sub-crack line CLR2 may be different from one another.

As shown in FIG. 3B, the width WR1 of the first right sub-crack line CLR1 may be equal to the width WR2 of the second right sub-crack line CLR2. The width WL1 of the first left sub-crack line CLL1 may be equal to the width WL2 of the second left sub-crack line CLL2. The width WC1 of the first central sub-crack line CLC1 may be equal to the width WC2 of the second central sub-crack line CLC2.

The width WL1 of the first left sub-crack line CLL1 and the width WL2 of the second left sub-crack line CLL2 may be larger than the width WR1 of the first right sub-crack line CLR1 and the width WR2 of the second right sub-crack line CLR2. The width WL1 of the first left sub-crack line CLL1 and the width WL2 of the second left sub-crack line CLL2 may be smaller than the width WC1 of the first central sub-crack line CLC1 and the width WC2 of the second central sub-crack line CLC2.

Since the resistances of the crack lines CL decrease as the widths of the crack lines CL increase. Accordingly, the resistance of the first right sub-crack line CLR1 and the resistance of the second right sub-crack line CLR2 may be greater than the resistance of the first left sub-crack line CLL1 and the resistance of the second left sub-crack line CLL2. The resistance of the first left sub-crack line CLL1 and the resistance of the second left sub-crack line CLL2 may be greater than the resistance of the first central sub-crack line CLC1 and the resistance of the second central sub-crack line CLC2.

Each width WC1 and WC2 of the first central sub-crack line CLC1 and the second central sub-crack line CLC2, each width WL1 and WL2 of the first left sub-crack line CLL1 and the second left sub-crack line CLL2, and each width WR1 and WR2 of the first right sub-crack line CL1 and the second right sub-crack line CLR2 are not particularly limited but may vary depending on design choice as long as they are different from one another.

Figure 4:
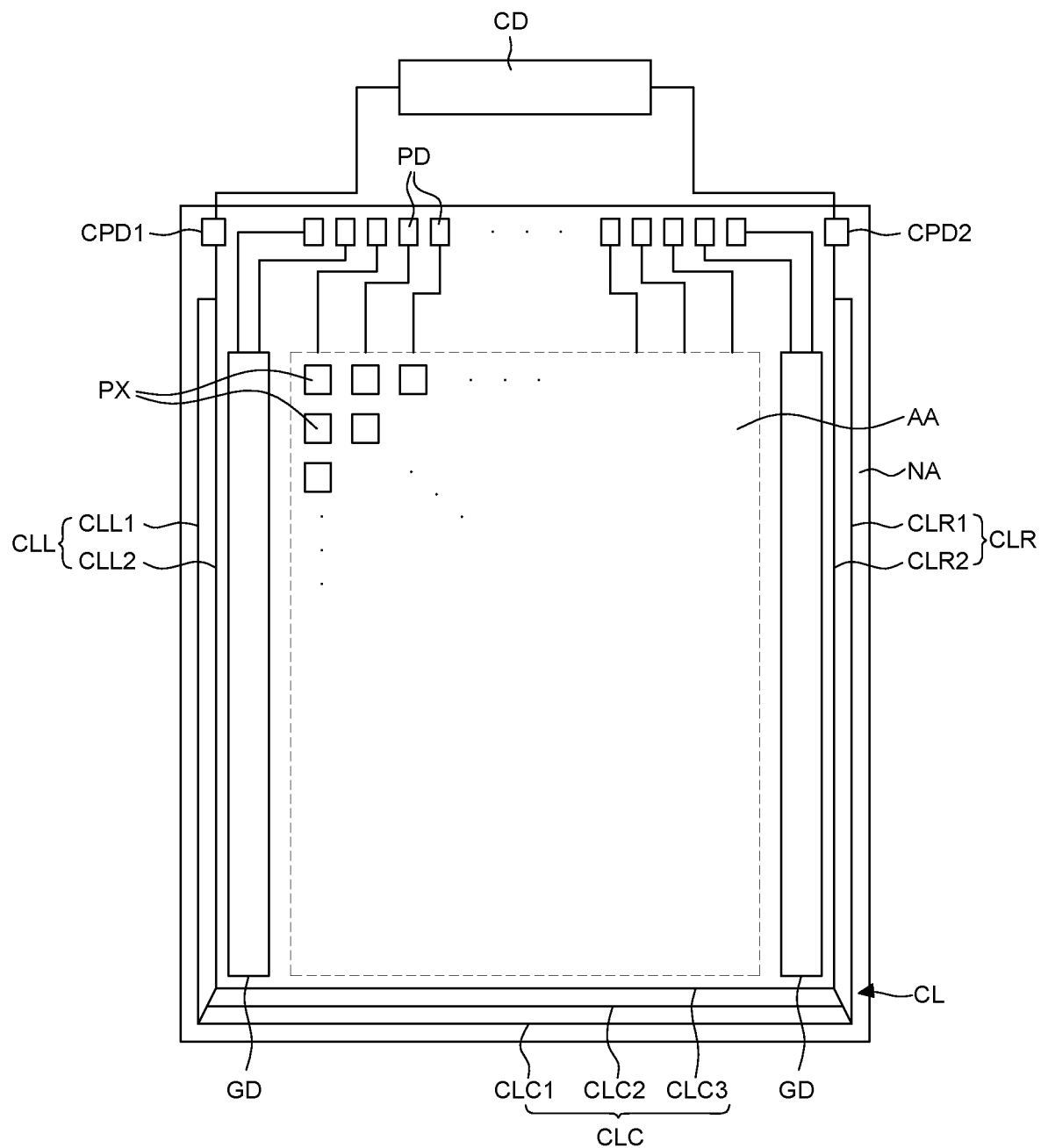
FIG. 4 is a view for illustrating the number of the crack lines of a display device according to an exemplary embodiment of the present disclosure.

FIG. 4 is a view for illustrating the number of the crack lines of a display device according to an exemplary embodiment of the present disclosure.

As described above, the resistances of the left crack line unit CLL, the right crack line unit CLR, and the central crack line unit CLC must be different from one another.

To this end, the numbers of the sub-crack lines CLL1, CLL2, CLC1, CLC2, CLC3, CLR1 and CLR2 of the left crack line unit CLL, the right crack line unit CLR and the central crack line unit CLC may be different from one another.

For example, as shown in FIG. 4, the left crack line unit CLL may include a first left sub-crack line CLL1 and a second left sub-crack line CLL2 connected in parallel. The right crack line unit CLR may include a first right sub-crack line CLR1 and a second right sub-crack line CLR2 connected in parallel. The central crack line unit CLC may include a first central sub-crack line CLC1, a second central sub-crack line CLC2 and a third central sub-crack line CLC3 connected in parallel.

Each of the left crack line unit CLL and the right crack line unit CLR may include two sub-crack lines CLL1 and CLL2, and CLR1 and CLR2 connected in parallel, while the central crack line unit CLC may include three sub-crack lines CLC1, CLC2 and CLC3 connected in parallel.

In this regard, if the lengths and widths of the crack lines CL are all equal, the greater the number of sub-crack lines connected in parallel, the smaller the total resistance of each of the crack line units becomes.

Since the number of the sub-crack lines of the central crack line unit CLC connected in parallel is larger than the number of sub-crack lines of each of the left crack line unit CLL and the right crack line unit CLR connected in parallel, the total resistance of the central crack line unit CLC is lower than the total resistance of each of the left crack line unit CLL and the right crack line unit CLR.

It is to be noted that the numbers of the sub-crack lines included in the left crack line unit CLL, and the right crack line unit CLR and the central crack line unit CLC are not limited to the above numbers and may very depending on design choice.

Figure 5:
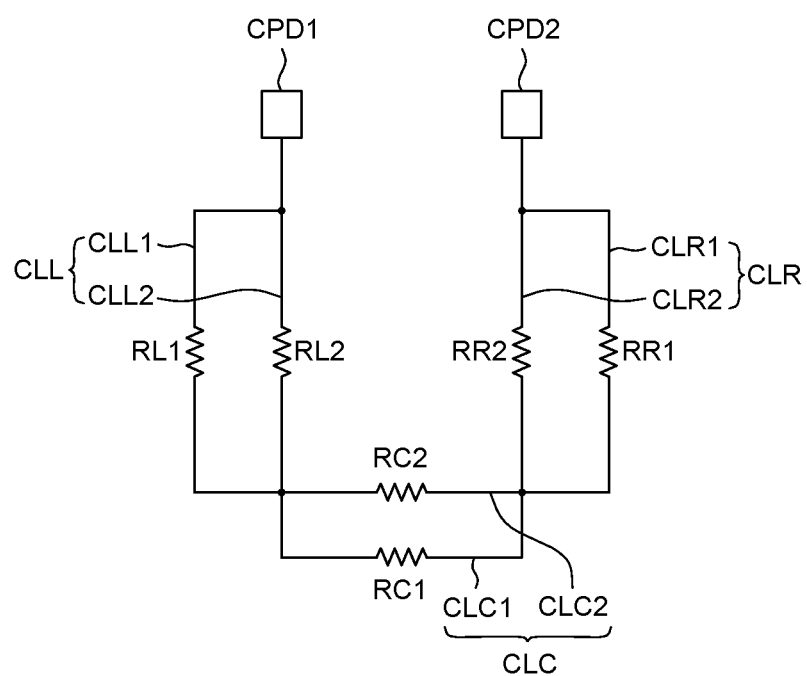
FIG. 5 is a circuit diagram for illustrating the resistances of the crack lines of a display device according to an exemplary embodiment of the present disclosure.

FIG. 5 is a circuit diagram for illustrating the resistances of the crack lines of a display device according to an exemplary embodiment of the present disclosure.

As shown in FIG. 5, the resistance of the left crack line unit CLL is equal to (RL1*RL2)/(RL1+RL2) as a resistor RL1 of the first left sub-crack line CLL1 and a resistor RL2 of the second left sub-crack line CLL2 are connected in parallel. When the resistor RL1 of the first left sub-crack line CLL1 and the resistor RL2 of the second left sub-crack line CLL2 have the same resistance, the resistance of the left crack line unit CLL is equal to RL1/2 or RL2/2.

Likewise, the resistance of the central crack line unit CLC is equal to (RC1*RC2)/(RC1+RC2) as a resistor RC1 of the first central sub-crack line CLC1 and a resistor RC2 of the second central sub-crack line CLC2 are connected in parallel. In addition, when the resistor RC1 of the first central sub-crack line CLC1 and the resistor RC2 of the second central sub-crack line CLC2 have the same resistance, the resistance of the central crack line unit CLC is equal to RC1/2 or RC2/2.

Likewise, the resistance of the right crack line unit CLR is equal to (RR1*RR2)/(RR1+RR2) as a resistor RR1 of the first right sub-crack line CLR1 and a resistor RR2 of the second right sub-crack line CLR2 are connected in parallel. When the resistor RR1 of the first right sub-crack line CLR1 and the resistor RR2 of the second right sub-crack line CLR2 have the same resistance, the resistance of the right crack line unit CLR is equal to RR1/2 or RR2/2.

In the following description, for convenience of illustration, the resistor RL1 of the first left sub-crack line CLL1 and the resistor RL2 of the second left sub-crack line CLL2 are set to 8 kΩ. The resistor RC1 of the first sub-crack line CLC1 and the resistor RC2 of the second central sub-crack line CLC2 are set to 4 kΩ. The resistor RR1 of the first right sub-crack line CLR1 and the resistor RR2 of the second right sub-crack line CLR2 are set to 16 kΩ. A change in the total resistance of the crack lines CL according to the number of cracks will be described.

By setting the resistors of the sub-crack lines CLL1, CLL2, CLC1, CLC2, CLR1 and CLR2 as described above, the resistance of the left crack line unit CLL becomes 4 kΩ, the resistance of the central crack line unit CLC becomes 2 kΩ, and the resistance of the right crack line unit CLR becomes 8 kΩ, such that the total resistance of the crack lines CL becomes 14 kΩ.

If a crack occurs in the center of the non-display area NA such that the first central sub-crack line CLC1 is broken, the resistor RC2 of the second central sub-crack line CLC2 becomes the resistance of the central crack line unit CLC. As a result, the resistance of the central crack line unit CLC increases from 2 kΩ to 4 kΩ. Accordingly, when a crack occurs in the center of the non-display area NA, the total resistance of the crack lines CL increases from 14 kΩ to 16 kΩ.

If a crack occurs in the left portion of the non-display area NA such that the first left sub-crack line CLL1 is broken, the resistor RL2 of the second left sub-crack line CLL2 becomes the resistance of the left crack line unit CLL. As a result, the resistance of the left crack line unit CLL increases from 4 kΩ to 8 kΩ. Accordingly, when a crack occurs in the left portion of the non-display area NA, the total resistance of the crack lines CL increases from 14 kΩ to 18 kΩ.

If a crack occurs in the right portion of the non-display area NA such that the first right sub-crack line CLR1 is broken, the resistor RR2 of the second right sub-crack line CLR2 becomes the resistance of the right crack line unit CLR. As a result, the resistance of the right crack line unit CLR increases from 8 kΩ to 16 kΩ. Accordingly, when a crack occurs in the right portion of the non-display area NA, the total resistance of the crack lines CL increases from 14 kΩ to 22 kΩ.

Next, if cracks occur on the left side and in the center of the non-display area NA such that the first left sub-crack line CLL1 and the first central sub-crack line CLC1 are broken, the resistor RL2 of the second left sub-crack line CLL2 becomes the resistance of the left crack line unit CLL, and the resistor RC2 of the second central sub-crack line CLC2 becomes the resistance of the central crack line unit CLC. Thus, the resistance of the left crack line unit CLL increases from 4 kΩ to 8 kΩ and the resistance of the central crack line unit CLC increases from 2 kΩ to 4 kΩ. Accordingly, when cracks occur on the left side and in the center of the non-display area NA, the total resistance of the crack lines CL increases from 14 kΩ to 20 kΩ.

If cracks occur on the right side and in the center of the non-display area NA such that the first right sub-crack line CLR1 and the first central sub-crack line CLC1 are broken, the resistor RR2 of the second right sub-crack line CLR2 becomes the resistance of the right crack line unit CLR, and the resistor RC2 of the second central sub-crack line CLC2 becomes the resistance of the central crack line unit CLC. Thus, the resistance of the right crack line unit CLR increases from 8 kΩ to 16 kΩ and the resistance of the central crack line unit CLC increases from 2 kΩ to 4 kΩ. Accordingly, when cracks occur on the right side and in the center of the non-display area NA, the total resistance of the crack lines CL increases from 14 kΩ to 24 kΩ.

If cracks occur on the left side and the right portion of the non-display area NA such that the first left sub-crack line CLL1 and the first right sub-crack line CLR1 are broken, the resistor RL2 of the second left sub-crack line CLL2 becomes the resistance of the left crack line unit CLL, and the resistor RR2 of the second right sub-crack line CLR2 becomes the resistance of the right crack line unit CLR. Thus, the resistance of the left crack line unit CLL increases from 4 kΩ to 8 kΩ and the resistance of the right crack line unit CLR increases from 8 kΩ to 16 kΩ. Accordingly, when cracks occur on the left side and right portion of the non-display area NA, the total resistance of the crack lines CL increases from 14 kΩ to 26 kΩ.

If cracks occur on the left side, the right side and in the center of the non-display area NA such that the first left sub-crack line CLL1, the first right sub-crack line CLR1 and the first central sub-crack line CLC1 are broken, the resistor RL2 of the second left sub-crack line CLL2 becomes the resistance of the left crack line unit CLL, the resistor RR2 of the second right sub-crack line CLR2 becomes the resistance of the right crack line unit CLR, and the resistor RC2 of the second central sub-crack line CLC2 becomes the resistance of the central crack line unit CLC. Thus, the resistance of the left crack line unit CLL increases from 4 kΩ to 8 kΩ, the resistance of the right crack line unit CLR increases from 2 kΩ to 4 kΩ, and the resistance of the central crack line unit CLC increases from 2 kΩ to 4 kΩ. Accordingly, when cracks occur on the left side, the right side and in the center of the non-display area NA, the total resistance of the crack lines CL increases from 14 kΩ to 28 kΩ.

As described above, the total resistance of the crack lines CL may very depending on which position of the display panel where a crack occurs and on the number of the cracks.

More specifically, if a crack occurs in the display panel, the resistance of each of the plurality of crack line units increases, so that the total resistance of the crack lines CL increases. Accordingly, the total resistance of the crack lines CL tends to increase with the number of cracks in the display panel.

The crack detecting unit CD measures a change in the total resistance of the crack lines CL to determine if there are cracks and the number of the cracks if any.

The operation of the crack detecting unit CD will be described with the above-described total resistance of the crack lines CL. When the total resistance of the crack lines CL is measured as 16 kΩ, the crack detecting unit CD determines that a crack has occurred in the center of the non-display area NA. When the total resistance of the crack lines CL is measured as 18 kΩ, the crack detecting unit CD determines that a crack has occurred on the left portion of the non-display area NA. When the total resistance of the crack lines CL is measured as 22 kΩ, the crack detecting unit CD determines that a crack has occurred on the right portion of the non-display area NA. When the total resistance of the crack lines CL is measured as 20 kΩ, the crack detecting unit CD determines that cracks have occurred on the left side and in the center of the non-display area NA. When the total resistance of the crack lines CL is measured as 24 kΩ, the crack detecting unit CD determines that cracks have occurred on the right side and in the center of the non-display area NA. When the total resistance of the crack lines CL is measured as 26 kΩ, the crack detecting unit CD determines that cracks have occurred on the left side and the right portion of the non-display area NA. When the total resistance of the crack lines CL is measured as 28 kΩ, the crack detecting unit CD determines that crack have occurred on the left side, in the center and on the right portion of the non-display area NA.

In the display device 100 according to the exemplary embodiment, one of the crack line units CLL, CLC and CLR is disposed on each side of the display panel. It is, however, to be understood that the present disclosure is not limited thereto. More than one crack line units may be disposed on one side of the display panel to detect the position of a crack more precisely. For example, two or more crack line units may be disposed on the left side of the display panel and connected in series to detect the position of a crack occurred at the left side of the display panel more precisely. Similarly, two or more crack line units may be disposed on the right side of the display panel and connected in series to detect the position of a crack occurred at the right side of the display panel more precisely, or two or more crack line units may be disposed on the central lower side of the display panel and connected in series to detect the position of a crack occurred at the central lower side of the display panel more precisely.

As described above, the display device according to the exemplary embodiment of the present disclosure includes the crack lines having the resistance that varies depending on the position and the number of cracks occurring at the edge of the display panel, and a crack detecting unit for determining the position and the number of cracks based on the resistance of the crack lines. Accordingly, the process of inspecting for cracks can be carried out by simply measuring the resistance of the crack lines and thus can become simpler.

Therefore, the display device according to the exemplary embodiment of the present disclosure requires no additional inspection personnel or inspection time, thereby improving the process yield of the display devices.

Hereinafter, a display device according to another exemplary embodiment of the present disclosure will be described with reference to FIG. 6. The display device according to the exemplary embodiment of FIG. 6 is substantially identical to the display device according to the above-described exemplary embodiment except the sub-crack lines are disposed on different layers; and, therefore, the redundant description will be omitted.

Figure 6:
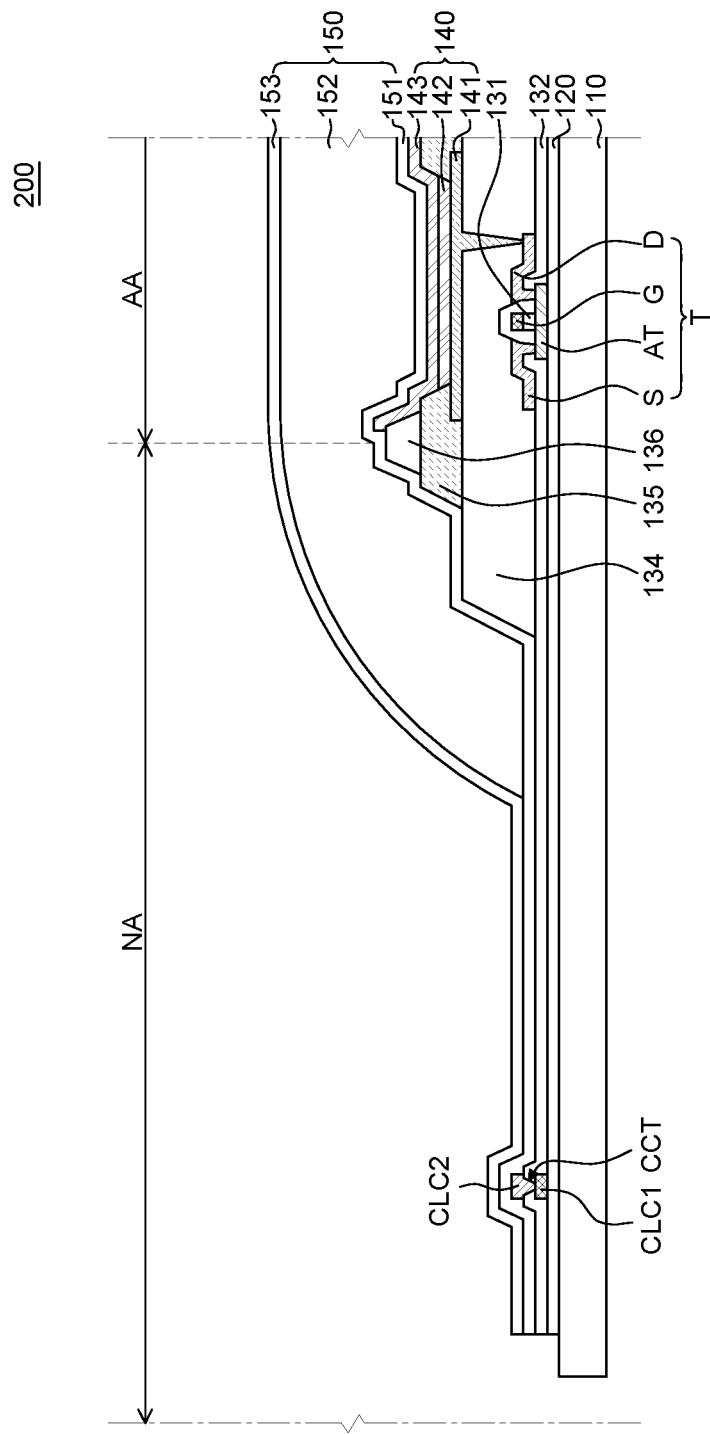
FIG. 6 is a cross-sectional view of a display device according to another exemplary embodiment of the present disclosure.

FIG. 6 is a cross-sectional view of a display device according to another exemplary embodiment of the present disclosure.

In a display device 200 according to the exemplary embodiment of the present disclosure, a plurality of sub-crack lines CLL1, CLL2, CLC1, CLC2, CLR1 and CLR2 may be formed on different layers.

Specifically, referring to FIG. 6, a first central sub-crack line CLC1 may be made of the same material as the gate electrode G on the buffer layer 120 and may be formed together with the gate electrode G. A second central sub-crack line CLC2 may be made of the same material as the source electrode S and the drain electrode D on the first central sub-crack line CLC1 and may be formed together with the source electrode S and the drain electrode D.

The first central sub-crack line CLC1 may be electrically connected to the second central sub-crack line CLC2 through a crack line contact hole CCT formed in the interlayer dielectric layer 132, so that the first central sub-crack line CLC1 may be connected to the second central sub-crack line CLC2 in parallel. The crack line contact hole CCT may be formed at both ends of the first and second central sub-crack lines CLC1 and CLC2 to connect them with each other.

Alternatively, the second central sub-crack line CLC2 may be made of the same material as the gate electrode G on the buffer layer 120 and may be formed together with the gate electrode G. The first central sub-crack line CLC1 may be made of the same material as the source electrode S and the drain electrode D on the first central sub-crack line CLC1 and may be formed together with the source electrode S and the drain electrode D.

In the display device 200 according to this exemplary embodiment of the present disclosure, the plurality of sub-crack lines CLL1, CLL2, CLC1, CLC2, CLR1 and CLR2 are on different layers, so that the area occupied by the crack lines can be reduced in the non-display area NA. For example, the sub-crack lines CLL1, CLC1 and CLR1 may partially or fully overlap the sub-crack lines CLL2, CLC2 and CLR2, in order to reduce the area occupied by the crack lines.

As the non-display area of the display device can be reduced, and thus the bezel area of the display device can be reduced.

The exemplary embodiments of the present disclosure can also be described as follows:

According to an aspect of the present disclosure, there is provided a display device, comprising: a display panel having a display area and a non-display area; transistors disposed in the display area and each comprising a gate electrode, a source electrode and a drain electrode; crack lines disposed in the non-display area; and a first crack pad and a second crack pad connected to both ends of the crack lines. The crack lines comprise a plurality of crack line units connected in series and each having different resistances. Each of the plurality of crack line units comprises a plurality of sub-crack lines connected in parallel. In this manner, the efficiency of inspecting for cracks can be improved.

The display device may further comprise a crack detecting unit connected to the first crack pad and the second crack pad and configured to detect a crack of the crack lines.

The crack lines may be formed in a same layer as the source electrode and the drain electrode.

The crack lines may be formed in a same layer as the gate electrode.

The plurality of crack line units may comprise a left crack line unit disposed in a left portion of the non-display area, a right crack line unit disposed in a right portion of the non-display area and a central crack line unit disposed in a central portion of the non-display area.

A number of left sub-crack lines that are connected in parallel and constitute the left crack line unit, a number of right sub-crack lines that are connected in parallel and constitute the right crack line unit, and a number of central sub-crack lines that are connected in parallel and constitute the central crack line unit may be different from one another.

The left crack line unit may comprise a first left sub-crack line and a second left sub-crack line connected in parallel, the right crack line unit may comprise a first right sub-crack line and a second right sub-crack line connected in parallel, and the central crack line unit may comprise a first central sub-crack line and a second central sub-crack line connected in parallel.

A resistance of the first left sub-crack line may be equal to a resistance of the second left sub-crack line, a resistance of the first right sub-crack line may be equal to a resistance of the second right sub-crack line, and a resistance of the first central sub-crack line may be equal to a resistance of the second central sub-crack line.

Each width of the first left sub-crack line and the second left sub-crack line, each width of the first right sub-crack line and the second right sub-crack line, and each width of the first central sub-crack line and the second central sub-crack line may be different from one another.

The first left sub-crack line, the first central sub-crack line and the first right sub-crack line may be formed in a same layer as the gate electrode, and the second left sub-crack line, the second central sub-crack line and the second right sub-crack line may be formed in a same layer as the source electrode and the drain electrode.

The first left sub-crack line, the first central sub-crack line and the first right sub-crack line may be formed in a same layer as the source electrode and the drain electrode, and the second left sub-crack line, the second central sub-crack line and the second right sub-crack line may be formed in a same layer as the gate electrode.

According to another aspect of the present disclosure, there is provided a display device comprising: a substrate on which a plurality of pixels is defined; crack lines surrounding the pixels; and a crack detecting unit configured to measure a resistance of the crack lines, wherein the resistance of the crack lines varies depending on a position and number of cracks. In this manner, it is possible to determine a position where cracks have occurred and the number of cracks during the process of inspecting for cracks.

The crack detecting unit may detect the resistances of the crack lines to determine the position and number of cracks.

The resistances of the crack lines may increase with the number of cracks.

The crack lines may comprise a plurality of crack line units connected in series along edges of the substrate and each having different resistances, and each of the plurality of crack line units may comprise a plurality of sub-crack lines connected in parallel.

The resistance of one of the plurality of crack line units where a crack may have occurred increases.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a display panel having a display area and a non-display area;
crack lines disposed in the non-display area; and
a first crack pad and a second crack pad connected to two ends of the crack lines, respectively,
wherein the crack lines comprise a plurality of crack line units connected to each other, and
wherein each of the plurality of crack line units comprises a plurality of sub-crack lines connected in parallel.

2. The display device of claim 1, further comprising:
a crack detecting unit connected to the first crack pad and the second crack pad and configured to detect a crack of the crack lines.

3. The display device of claim 1, further comprising:
transistors disposed in the display area and each comprising a gate electrode, a source electrode, and a drain electrode.

4. The display device of claim 3,
wherein the crack lines are formed in a same layer as the source electrode and the drain electrode.

5. The display device of claim 3,
wherein the crack lines are formed in a same layer as the gate electrode.

6. The display device of claim 1,
wherein the plurality of crack line units are connected in series and each have different resistance.

7. The display device of claim 1,
wherein the plurality of crack line units comprises:
a left crack line unit disposed in a left portion of the non-display area;
a right crack line unit disposed in a right portion of the non-display area; and
a central crack line unit disposed in a central lower portion of the non-display area.

8. The display device of claim 7,
wherein a number of left sub-crack lines that are connected in parallel and constitute the left crack line unit, a number of right sub-crack lines that are connected in parallel and constitute the right crack line unit, and a number of central sub-crack lines that are connected in parallel and constitute the central crack line unit are different from one another.

9. The display device of claim 7,
wherein the left crack line unit comprises a first left sub-crack line and a second left sub-crack line connected in parallel,
wherein the right crack line unit comprises a first right sub-crack line and a second right sub-crack line connected in parallel, and
wherein the central crack line unit comprises a first central sub-crack line and a second central sub-crack line connected in parallel.

10. The display device of claim 9,
wherein a resistance of the first left sub-crack line is equal to a resistance of the second left sub-crack line,
wherein a resistance of the first right sub-crack line is equal to a resistance of the second right sub-crack line, and
wherein a resistance of the first central sub-crack line is equal to a resistance of the second central sub-crack line.

11. The display device of claim 10,
wherein widths of the first left sub-crack line and the second left sub-crack line, widths of the first right sub-crack line and the second right sub-crack line, and widths of the first central sub-crack line and the second central sub-crack line are different from one another.

12. The display device of claim 9,
wherein the first left sub-crack line, the first central sub-crack line, and the first right sub-crack line are formed in a same layer as the gate electrode, and
wherein the second left sub-crack line, the second central sub-crack line, and the second right sub-crack line are formed in a same layer as the source electrode and the drain electrode.

13. The display device of claim 9,
wherein the first left sub-crack line, the first central sub-crack line, and the first right sub-crack line are formed in a same layer as the source electrode and the drain electrode, and
wherein the second left sub-crack line, the second central sub-crack line and the second right sub-crack line are formed in a same layer as the gate electrode.

14. The display device of claim 13,
wherein the first left sub-crack line and the second left sub-crack line are disposed to be overlapped with each other,
wherein the first right sub-crack line and the second right sub-crack line are disposed to be overlapped with each other, and
wherein the first central sub-crack line and the second central sub-crack line are disposed to be overlapped with each other.

15. The display device of claim 9,
wherein the first left sub-crack line is disposed more adjacent to a left side of the display panel than the second left sub-crack line,
wherein the first right sub-crack line is disposed more adjacent to a right side of the display panel than the second right sub-crack line, and
wherein the first central sub-crack line is disposed more adjacent to the central lower side of the display panel than the second central sub-crack line.

16. The display device of claim 1,
wherein the plurality of crack line units comprises:
two or more left crack line units connected in series and disposed in a left portion of the non-display area;
two or more right crack line units connected in series and disposed in a right portion of the non-display area; and two or more central crack line units connected in series and disposed in a central lower portion of the non-display area.

17. A display device comprising:
a substrate on which a plurality of pixels is defined;
crack lines surrounding the plurality of pixels, wherein the crack lines comprise a plurality of crack line units connected in series along edges of the substrate and each having different resistances, and wherein each of the plurality of crack line units comprises a plurality of sub-crack lines connected in parallel; and
a crack detecting unit configured to measure a resistance of the crack lines,
wherein the resistance of the crack lines changes depending on a position and number of cracks.

18. The display device of claim 17,
wherein the crack detecting unit detects the resistances of the crack lines to determine the position and number of cracks.

19. The display device of claim 17,
wherein the resistances of the crack lines increase with the number of cracks.

20. The display device of claim 17,
wherein the resistance of one of the crack lines where a crack has occurred increases.

* * * * *